United States Patent
Schneider et al.

(10) Patent No.: US 6,940,775 B2
(45) Date of Patent: Sep. 6, 2005

(54) INTEGRATED DYNAMIC MEMORY HAVING A CONTROL CIRCUIT FOR CONTROLLING A REFRESH MODE FOR MEMORY CELLS

(75) Inventors: Ralf Schneider, München (DE); Manfred Pröll, Dorfen (DE); Georg Erhard Eggers, München (DE); Jörg Kliewer, München (DE)

(73) Assignee: Infineon Technologies, AG (DE)

( * ) Notice: Subject to any disclaimer, the term of this patent is extended or adjusted under 35 U.S.C. 154(b) by 0 days.

(21) Appl. No.: 10/823,608

(22) Filed: Apr. 14, 2004

(65) Prior Publication Data

US 2004/0218458 A1 Nov. 4, 2004

(30) Foreign Application Priority Data

Apr. 15, 2003 (DE) .......................................... 103 17 364

(51) Int. Cl.[7] .................................................. G11C 7/00
(52) U.S. Cl. ...................................... 365/222; 365/211
(58) Field of Search ................................. 365/222, 211, 365/203

(56) References Cited

U.S. PATENT DOCUMENTS

| | | | |
|---|---|---|---|
| 5,532,968 A | | 7/1996 | Lee |
| 6,084,812 A | * | 7/2000 | Joo .............................. 365/222 |
| 6,438,057 B1 | * | 8/2002 | Ruckerbauer ................ 365/222 |
| 6,809,980 B2 | * | 10/2004 | Schnabel et al. ............ 365/222 |

* cited by examiner

Primary Examiner—Gene N. Auduong
(74) Attorney, Agent, or Firm—Edell, Shapiro & Finnan, LLC

(57) ABSTRACT

An integrated dynamic memory includes memory cells which are combined to form individual independently addressable units, and a control circuit for controlling a refresh mode for the memory cells. The memory cells can have their memory cell content refreshed. The control circuit is designed such that one or more units of memory cells can be subject to a refresh mode in parallel in a refresh cycle. The control circuit sets a number of memory cell units, which are to be refreshed in parallel in a refresh cycle based on a temperature reference value. A maximum possible operating temperature for a memory chip can be increased without additional restrictions on memory access.

9 Claims, 2 Drawing Sheets

INTEGRATED DYNAMIC MEMORY HAVING A CONTROL CIRCUIT FOR CONTROLLING A REFRESH MODE FOR MEMORY CELLS

CROSS REFERENCE TO RELATED APPLICATIONS

This application claims priority under 35 USC §119(e) to German Application No. 10317364.1, filed on Apr. 15, 2003, and titled "Integrated Dynamic Memory Having A Control Circuit For Controlling A Refresh Mode For Memory Cells," the entire contents of which are hereby incorporated by reference.

FIELD OF THE INVENTION

The present invention relates to an integrated dynamic memory having memory cells which are combined to form individual independently addressable units, and also having a control circuit for controlling a refresh mode for the memory cells, in which the memory cells have their memory cell content refreshed.

BACKGROUND

An integrated dynamic memory in the form of a DRAM generally has a memory cell array, which comprises word lines and bit lines. In this context, the memory cells are arranged at crossover points between the bit lines and word lines. For example, the memory cells are constructed from a storage capacitor and a selection transistor, with the selection transistor connecting the respective storage capacitor to one of the bit lines. Control connections on the respective selection transistors are respectively connected to one of the word lines in order to select the memory cells. An activated word line respectively turns on connected selection transistors. Following selection of a word line, the bit lines in question carry data signals associated with the memory cells along the selected word line. A data signal associated with a selected memory cell is assessed and amplified in a sense amplifier in the memory cell array. During read access the data signals associated with selected memory cells are read for the purpose of further processing, and during write access data signals which are to be written are written to the selected memory cells.

In integrated dynamic memories in the form of DRAMs, a "refresh mode" is required at operating times at which no external access to memory cells is taking place, in order to refresh and thus permanently retain the memory cell content, which may disappear as a result of leakage currents in the storage capacitor or selection transistor, for example. In refresh mode, the assessed and amplified data signals from selected memory cells are written back directly to the memory cells in question. This is generally controlled by a control circuit which also stipulates a refresh rate at which the memory cell content is respectively refreshed.

Particularly for DRAM memory chips, the user generally demands ever higher operating temperatures. In this context, however, it should be noted that the data retention time of the memory cells decreases as the operating temperature increases, since the storage capacitor's and/or the respective selection transistor's leakage currents arising in the memory cells increase as operating temperatures rise. In this case, the refresh rate can be chosen to be lower the longer the maximum attainable data retention time of a memory cell, and hence, the possible period between two refresh cycles for this memory cell. To date, the described temperature response of the data retention time specifies a common maximum operating temperature, and hence a defined refresh rate, generally for all DRAM memory chips of one type, which means that excessive restrictions on memory access on account of pauses in memory access which are induced by the refresh mode are thus avoided.

SUMMARY

An integrated dynamic memory in which a significant increase in the maximum possible operating temperature can be possible without additional restrictions on memory access.

Such an integrated dynamic memory can have memory cells, which are combined to form individual independently addressable units, and a control circuit for controlling a refresh mode for the memory cells. The control circuit can be designed such that one or more units of memory cells can be subject to a refresh mode in parallel in a refresh cycle. In this context, the control circuit can set a number of memory cell units, which are to be refreshed in parallel in a refresh cycle based on a temperature reference value. The temperature reference value can be generated by a temperature sensor circuit, for example, which can be arranged on the memory and can measure the substrate temperature, in particular. Hence, the memory can hold a control circuit for controlling a refresh mode for the memory cells. The control circuit can be used to account for the temperature response of the data retention time of the memory cells.

By subjecting one or more units of memory cells to a refresh mode in parallel in a refresh cycle, the refresh rate can be increased without being visible to a user outside of the memory. In particular, no additional pauses in memory access are required. Rather, a temperature-controlled increase in the refresh rate can be attained by increasing the number of memory cell units which are to be refreshed in parallel in the refresh cycle. This can allow an increase in a maximum possible operating temperature for a memory chip without additional restrictions on memory access.

Previously, the memory content of memory cells was refreshed along just one word line in a refresh cycle upon every refresh command. According to the invention, a plurality of mutually independent units of memory cells, particularly the memory cells along a number of a plurality of word lines, can be refreshed in parallel in a refresh cycle. As a result, the time between two refresh operations can decrease for memory cells. Since, in this case, the refresh operations due to a refresh command can occur in parallel, additional commands or waiting times are not necessary as compared with a normal mode when just one word line is refreshed.

The control circuit can have a changeover mechanism implemented such that, if a limit temperature reference value is exceeded, not only a selected unit of memory cells, but also at least one further unit of memory cells, can be subject to a refresh mode in parallel in a refresh cycle.

If the parallel activation of a plurality of units of memory cells within a refresh cycle results in unwanted current spikes in the current drawn by the integrated memory, a time shift for the refresh operations within a refresh cycle can occur. Accordingly, the control circuit can be designed such that a plurality of units of memory cells can be subject to a refresh mode in parallel in a refresh cycle, but staggered over time with respect to one another within a refresh interval. A time shift for the refresh operations can be possible against the background that the actual refresh time is generally shorter than a refresh cycle's refresh interval specified in the memory's specification.

BRIEF DESCRIPTION OF THE FIGURES

The invention is explained in more detail below with reference to the figures shown in the drawing, which show exemplary embodiments of the present invention. In the drawings.

DETAILED DESCRIPTION

Figure 1:
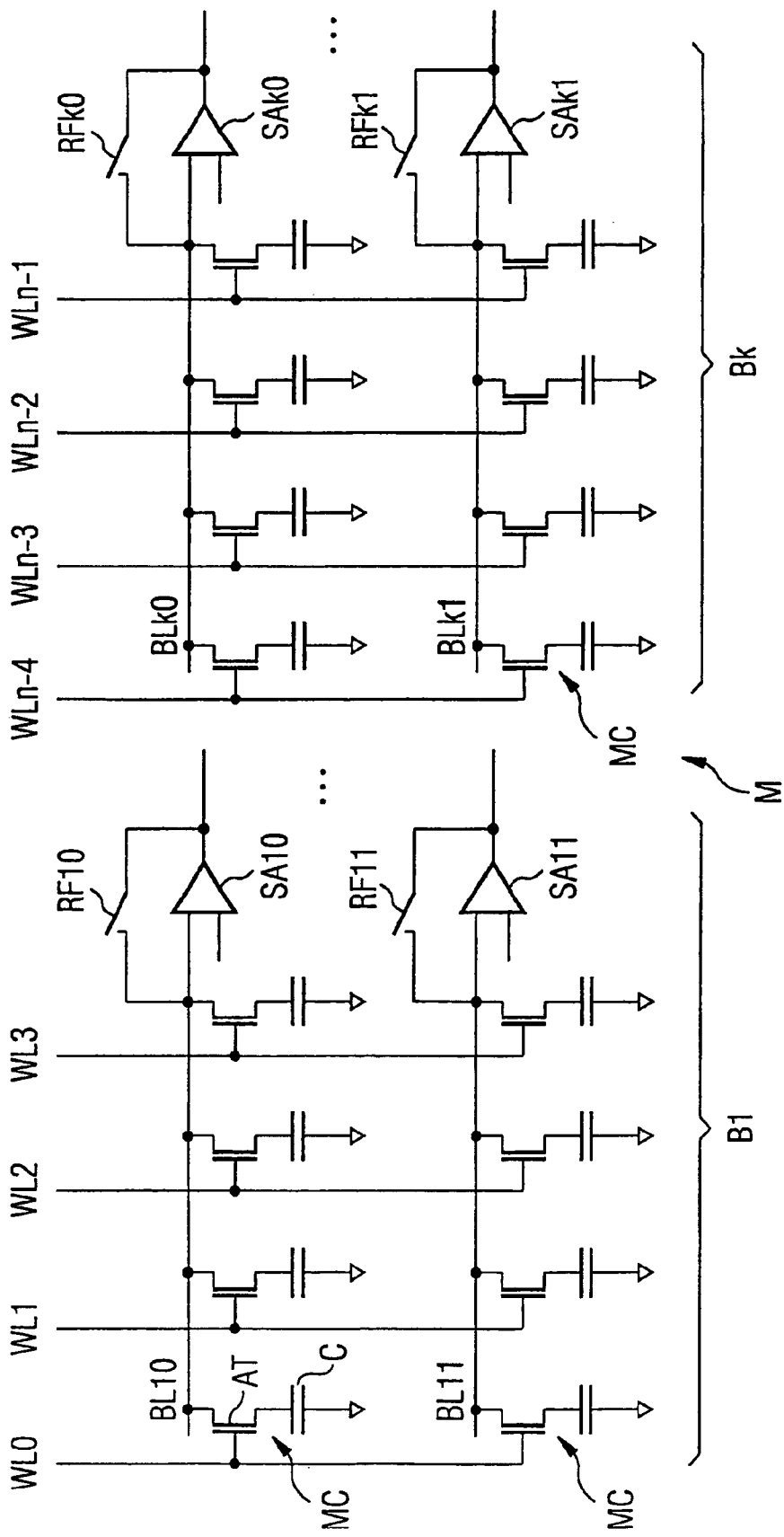
FIG. 1 shows an embodiment of a memory cell array in an integrated memory.

FIG. 1 shows an embodiment of a memory cell array in an integrated memory M in line with the invention. The memory cell array can be divided into a plurality of similar blocks B1 to Bk. In this context, memory cells MC can be arranged along word lines WL0 to WLn−1 (k blocks each containing m word lines, k×m=n) and bit lines BL10 to BLk1. In this case, FIG. 1 shows an exemplary number of word lines and bit lines. The memory cells MC can be arranged at crossover points between the bit lines and word lines. The memory cells MC each can include a storage capacitor C, which is connected to one of the bit lines via a selection transistor AT. To select one of the memory cells MC, the respective selection transistor AT can be turned on by an activated word line, which can subsequently allow a data signal associated with the selected memory cell MC to be read or written using a sense amplifier SA10 to SAk1. The data signal associated with the selected memory cell can be carried by a bit line in question and can be assessed and amplified in one of the sense amplifiers SA10 to SAk1. Normally, memories of the stated type can have the individual bit lines, respectively, divided into a plurality of separate segments including, respectively, independent sense amplifiers. This is not shown in more detail in FIG. 1, however, for the sake of clarity.

For a refresh operation, the data signals assessed and amplified by the respective sense amplifier SA10 to SAk1 can be written back directly to the memory cells MC in question, for example, is indicated by the schematically shown refresh circuits RF10 to RFk1. To this end, a control circuit can be provided, as described in more detail below with reference to FIG. 3. Particularly as a result of the respectively necessary activation of sense amplifiers, a refresh mode in the memory requires a current to be drawn which correlates to the refresh rate. In the interest of drawing as little current as possible, the period between two refresh cycles can be proportioned to be as long as possible so that the refresh rate can be as low as possible. In this case, the maximum attainable data retention time of the memory cells can determine the period, which can be required between two refresh cycles. This period is influenced, in particular, by leakage currents in the storage capacitor and/or selection transistor, which can rise as memory temperatures increase.

Figure 2:
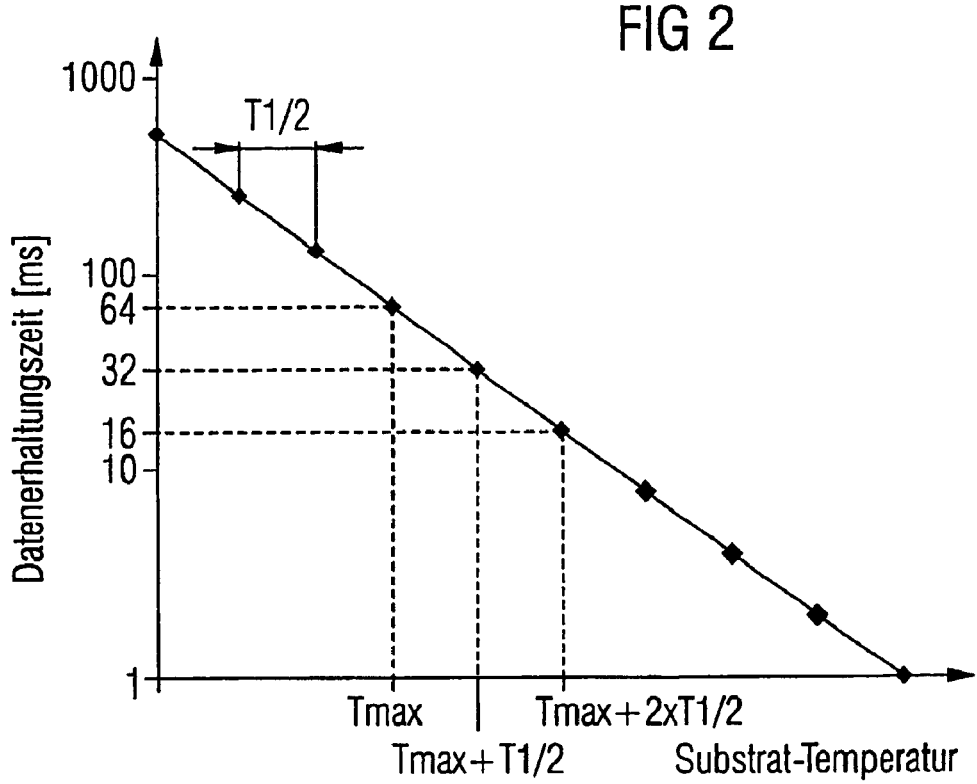
FIG. 2 shows a fictional but qualitatively typical curve for a data retention time for memory cells as a function of the substrate temperature.

In this connection, FIG. 2 shows a fictional but qualitatively typical curve for a data retention time for memory cells as a function of the substrate temperature of the memory. An exponential dependency with a negative exponent can be obtained. The dependency can be characterized by a "half-value temperature" T½. In this context, the half-value temperature T½ can identify a temperature interval within which the data retention time of the memory cells can be halved. In the graphics shown in FIG. 2, the exponential dependency can be linearized by a logarithmic representation of the data retention time. In this context, exemplary values of the data retention time are shown as a function of the substrate temperature. The half-value temperature is denoted by T½.

The operating temperature range of the memory can be included by shortening the time between the refresh operations for the memory cells, since operating temperature can rise in order to compensate for the shortened data retention time without additional restrictions on memory access arising. To date, refreshing of the memory cells has usually always been performed for the memory cells along just one word line. The refresh operations are normally initiated by a memory controller which sends a refresh command. In a known embodiment of a refresh control circuit, this command is sent to a counter circuit. A multiplexer circuit then takes the counter value in the counter circuit as a basis for selecting a word line in the memory for refreshing. A specification for, in particular, SDRAM chips, stipulates that it is necessary to wait a particular time before the next memory access after a refresh command has been initiated. Within this time, the memory can refresh the memory cells in question without external interference. It is customary in this context for a firm data retention time to be specified for the memory cells. The memory controller then needs to initiate as many refresh commands within this time as there are word lines in the memory.

Figure 3:
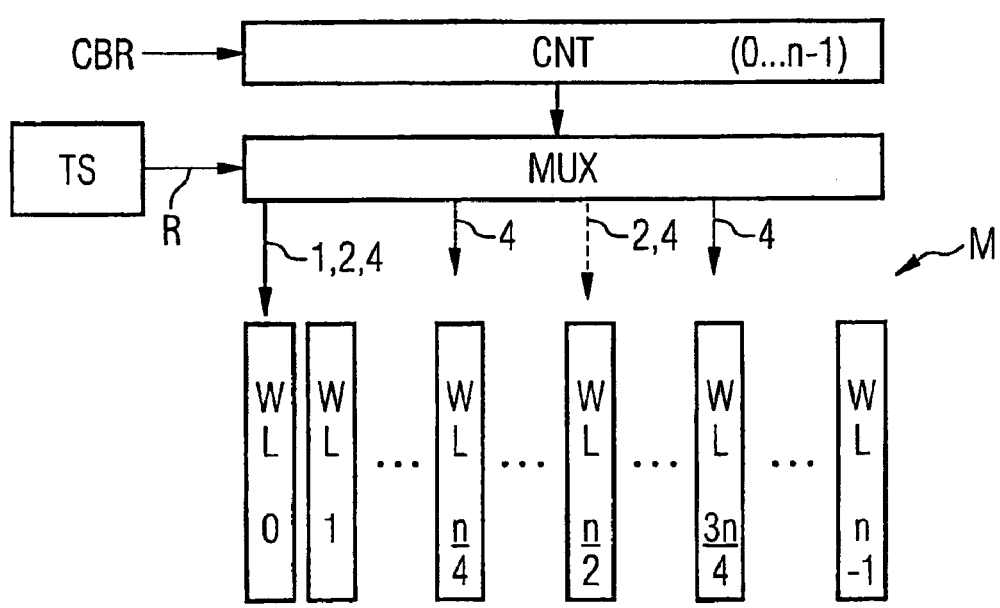
FIG. 3 shows a schematic illustration of an embodiment of an integrated memory having a refresh control circuit in line with the invention.

FIG. 3 schematically shows an embodiment of an integrated memory having a refresh control circuit in line with the invention. The control circuit can have a counter circuit CNT for addressing memory cell units, which are to be refreshed in the form of n whole word lines WL0 to WLn−1. The counter circuit can receive a refresh command CBR from a memory controller (not shown). In addition, a multiplexer circuit MUX can be actuated by the counter circuit CNT. The multiplexer circuit MUX can be used to select the word lines for a refresh mode. In this context, the multiplexer circuit MUX can receive a control signal R, which can transmit a temperature reference value, which can be generated by a temperature sensor circuit TS. This circuit can be arranged on the memory. The counter circuit CNT can address the word lines WL0 to WLn−1 in order and can actuate the multiplexer circuit MUX accordingly. The multiplexer circuit can then select word lines in the memory for refreshing based on the count value.

The multiplexer circuit MUX can refresh a plurality of word lines in parallel based on temperature. In this context, the memory cells in units of a whole word line can be subject to a refresh mode in a refresh cycle. The multiplexer circuit MUX can have a changeover mechanism implemented therein according to which, if a limit temperature reference value is exceeded, not only a selected word line, but also at least one further word line, can be subject to a refresh mode in parallel in a refresh cycle. In this context, the multiplexer circuit MUX can set the number of word lines, which are to be refreshed in parallel in a refresh cycle based on the temperature reference value R. The number of simultaneously refreshed word lines needs to be doubled at respective temperature intervals based on the half-value temperature.

In the present case, the multiplexer circuit MUX for actuating n word lines can be changed over, if a limit temperature Tmax is exceeded such that not only the selected word line, but also a word line shifted by the number of n/2 word lines, can be selected and can be subject to a refresh mode in parallel in a refresh cycle. For example, not only the selected word line WL0, but also the word line WLn/2 shifted by the number of n/2 word lines, can be selected and their memory cells can be refreshed. If a further limit temperature reference value Tmax+T½, increased by the temperature interval of the half-value temperature T½, is exceeded, not only the selected word line but also a respective word line shifted by the number of n/4, n/2 and 3n/4 word lines can be subject to a refresh mode in parallel in a refresh cycle. For example, not only the selected word line WL0, but also the word lines WLn/4 and WL3n/4 shifted by n/4 and 3n/4 word lines, can be activated in addition to the word line WLn/2 already additionally activated. This changeover principle can be continued, but is normally limited by the fact that two word lines having less than a critical spacing can no longer be simultaneously refreshed independently through joint use of the same circuit parts (for example sense amplifiers).

The exemplary changeover principle is described below for parallel activation of a number of word lines.

At a substrate temperature T<Tmax, the word line WL0 can activate by the control signal 1. At a substrate temperature Tmax<T<Tmax+T½, the control signals 2 can activate the word lines WL0 and WLn/2 for refreshing. At a substrate temperature Tmax+T½<T<Tmax+2T½, the word lines WL0, WLn/4, WLn/2 and WL3n/4 can be activated for refreshing by the control signals 4.

The multiplexer circuit MUX can subject a plurality of word lines to a refresh mode in parallel in a refresh cycle, but staggered over time within a refresh interval. This allows a time shift for the refresh operations, so that current spikes during the refresh operation as a result of parallel activation of a plurality of word lines can be avoided.

When designing an integrated dynamic memory in line with the invention, it should generally be noted that the number of refresh commands ("burst CBRs") executed in direct succession needs to be limited. If the number of refresh commands executed in succession is more than n/x (n is the number of word lines, x is the number of simultaneously refreshed word lines), then some of the memory cells are first of all refreshed a plurality of times in direct succession and would then need to weather a relatively long period without refreshing. This would not result in the desired effect of very short refresh times, however.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

List of Reference Symbols

M Memory
MC Memory cells
WL0 to WLn−1 Word lines
BL10 to BLk1 Bit lines
C Storage capacitor
AT Selection transistor
SA10 to SAk1 Sense amplifier
RF10 to RFk1 Refresh circuit
B1 to Bk Block
R Control signal with temperature reference value
CBR Refresh command
Tmax Limit temperature reference value
T½ Half-value temperature
CNT Counter circuit
MUX Multiplexer circuit
TS Temperature sensor circuit
1 to 4 Control signal

We claim:

1. An integrated dynamic memory, comprising:
  a plurality of memory cells, the memory cells being combined to form individual independently addressable units; and
  a control circuit for controlling a refresh mode for the memory cells, the memory cells having their memory cell content refreshed during the refresh mode,
  the control circuit being designed such that one or more units of memory cells can be subject to the refresh mode in parallel in a refresh cycle, the control circuit setting a number of memory cell units which are to be refreshed in parallel in a refresh cycle based on a temperature reference value.

2. The integrated dynamic memory as claimed in claim 1, wherein the control circuit has a changeover mechanism such that, if a first limit temperature reference value is exceeded, a selected unit of memory cells and at least one further unit of memory cells are subject to the refresh mode in parallel in the refresh cycle.

3. The integrated dynamic memory as claimed in claim 1, wherein the memory is organized into word lines and bit lines, the memory cells being arranged at crossover points between the word lines, the memory cells bit lines and being connected to a respective word line and bit line, the memory cells in units of a whole word line subject to a refresh mode in a refresh cycle, and the control circuit sets a number of word lines which are to be refreshed in parallel in a refresh cycle based on the temperature reference value.

4. The integrated dynamic memory as claimed in claim 3, wherein the memory has a number of n word lines, the control circuit has a changeover mechanism such that, if a first limit temperature reference value is exceeded, a selected word line and a word line shifted by the number of n/2 word lines are select and are subjected to a refresh mode in parallel in a refresh cycle.

5. The integrated dynamic memory as claimed in claim 4, wherein the control circuit has a changeover mechanism such that, if a second limit temperature reference value increased by a temperature interval is exceeded, not only the selected word line and a respective word line shifted by the number of n/4, n/2, and 3n/4 word lines are subjected to a refresh mode in parallel in a refresh cycle.

6. The integrated dynamic memory as claimed in claim 5, wherein the temperature interval has been set in the control circuit to a half-value temperature which identifies a temperature interval within which the data retention time of the memory cells is halved.

7. The integrated dynamic memory as claimed in claim 1, wherein the control circuit has a counter circuit for addressing memory cell units which are to be refreshed, which receives a refresh command and a multiplexer circuit, and the multiplexer being actuated by the counter circuit for selecting the units (WL0 to WLn−1) of memory cells for a refresh mode, where the multiplexer circuit receives a control signal (R) which transmits the temperature reference value.

8. The integrated dynamic memory as claimed in claim 1, wherein the temperature reference value is generated by a temperature sensor circuit which is arranged on the memory.

9. The integrated dynamic memory as claimed in claim 1, wherein the control circuit is designed such that a plurality of units of memory cells can be subject to a refresh mode in parallel in a refresh cycle, the refresh mode being staggered over time within a refresh interval.

* * * * *